United States Patent [19]

Gall et al.

[11] 3,873,756

[45] Mar. 25, 1975

[54] INSULATING LINING FOR METALLIC CIRCUIT BOARD TERMINAL HOLES

[75] Inventors: Andrew S. Gall, Fort Wayne; Joseph W. Cranmer, New Haven, both of Ind.

[73] Assignee: Gridcraft, Inc., Ft. Wayne, Ind.

[22] Filed: Feb. 12, 1973

[21] Appl. No.: 331,568

Related U.S. Application Data

[62] Division of Ser. No. 114,252, Feb. 10, 1971, abandoned.

[52] U.S. Cl................... 174/68.5, 117/212, 317/101

[51] Int. Cl. ............................................ H05k 1/04

[58] Field of Search........ 174/68.5; 317/100, 101 B, 317/101 C; 204/15, 38; 117/212, 98

[56] References Cited

UNITED STATES PATENTS

| | | | |
|---|---|---|---|
| 3,202,591 | 8/1965 | Curran | 174/68.5 X |
| 3,206,342 | 9/1965 | Briggs | 174/68.5 X |
| 3,268,653 | 8/1966 | McNutt | 174/68.5 |
| 3,312,870 | 4/1967 | Rhoades | 174/68.5 X |
| 3,385,732 | 5/1968 | Curran | 174/68.5 X |
| 3,745,095 | 7/1973 | Chadwick et al. | 174/68.5 U |

*Primary Examiner*—Darrell L. Clay

[57] ABSTRACT

A circuit board made according to the method of insulating the terminal holes passing through a printed-circuit board having a metallic core wherein the surfaces of the circuit board carrying the printed-circuits are first overlaid with a protective layer of polyester material. Holes are drilled or punched through the printed-circuit board as dictated by the circuit requirements, and the holes are filled with a flowable insulating material. Air is caused to flow through the holes thereby removing excess insulating material therefrom, and leaving a portion of the insulating material adhered to the walls of the holes. The insulating material is dried and cured to form a hardened lining of insulating material in the holes. The circuit board is the product resulting from practice of the aforesaid method.

6 Claims, 3 Drawing Figures

INSULATING LINING FOR METALLIC CIRCUIT BOARD TERMINAL HOLES

This is a divisional of application Ser. No. 114,252, filed Feb. 10, 1971 now abandoned.

BACKGROUND OF THE INVENTION

1. Field of the Invention

This invention relates to printed circuitboards having insulated holes.

2. Description of the Prior Art

The introduction of the metallic core, printed-circuit board offers greater flexibility in overall printed-circuit board design. The metal core of the laminate, which may be aluminum, may dissipate a significant amount of component produced heat, and the metallic circuit-board can be formed and shaped into many configurations for optimum packaging design. However, notwithstanding the advantages aforementioned, one of the shortcomings of this metal circuit board is the tedium of insulating each terminal hole by the insertion of insulator sleeves thereinto or the provision of solid insulators in pre-drilled holes later drilled to smaller diameters. This has provded to be time consuming and obviously expensive. It is a purpose of this invention to overcome certain of the prior art problems connected with the manufacture of such circuit boards.

SUMMARY OF THE INVENTION

Therefore, an important object of this invention is to provide a circuit board having holes lined uniquely with insulating material.

The above-mentioned and other features and objects of this invention and the manner of attaining them will become more apparent and the invention itself will be best understood by reference to the following description of an embodiment of the invention taken in conjunction with the accompanying drawings.

DESCRIPTION OF A SPECIFIC EMBODIMENT

Figure 1:
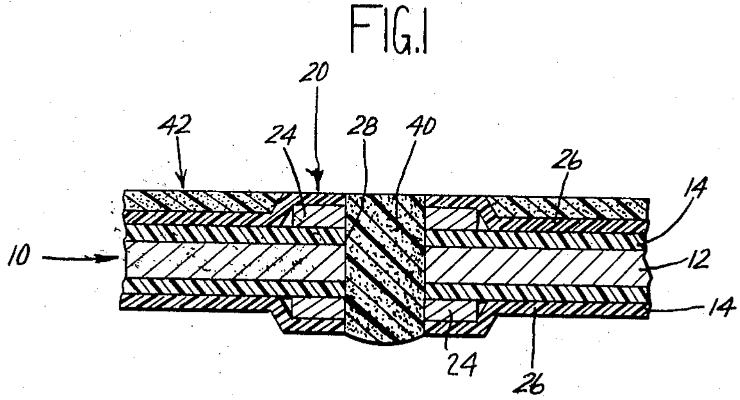
FIG. 1 is an enlarged fragmentary sectional view of a terminal hole portion of circuit board illustrating the terminal hole as it appears after one step in the process of fabricating the circuit board.

Referring to FIG. 1, the numeral 10 designates a laminated circuit board having as the main supporting laminate or core a suitably thick plate or panel 12 of metallic material, such as aluminum. The board 10 in its raw state prior to having a printed-circuit formed thereon and processing according to the invention, includes a metal plate 12, a polyethylene laminate or film 14, and a copper laminate or sheet on the film 14. The polyethylene film 14 and copper sheet may be attached to one or both sides as required. As observed with reference to FIG. 1, the polyethylene and copper are fixed to both sides of the metal core portion 12, which, as disclosed, is aluminum The circuit board 10 is first cut to the desired size and thoroughly cleaned. The desired circuit pattern is formed in the copper sheet according to any well known technique, such as photo engraving, silk-screening and the like. It should be noted that during formation of the printed-circuit, the edges of the circuit board are coated with an etch resistant material, such as tape or an acid resistant paste, which prevents contamination of the etch bath and corrosion of the edges of the metallic core 12 when the etching is performed on the copper 16 to remove the unneeded portions thereof. The techniques used in fabricating the circuit board, i.e., cleaning, applying the circuit pattern to the copper film, and etching or engarving of the circuit, are well known to those skilled in the art and need not be further elaborated here.

The circuit board 10 when completed has a copper printed-circuit 20 formed thereon. The polyethylene film 14 carries the copper printed-circuit 20 and insulates the printed-circuit 20 from the aluminum sheet 12. The printed-circuit 20 includes strips or segments having enlarged areas 24 which provide terminal portions for connection of circuit components, such as resistors, et cetera.

A protective film of flexible abrasion resistant plastic, such as polyester or the like material, 26 having a pressure sensitive adhesive on one surface, is applied over the printed-circuit to protect the circuit against damage during further processing. Terminal or the like holes as at 28 are punched or drilled through the protective film 26 and the board 10 through the central portion of the enlarged areas 24. The drilled board 10 is then positioned horizontally in a box (not shown) for further processing.

The box is equipped with a horizontal partition, having an opening dimensioned to receive the circuit board 10 in such a manner as to divide the box into upper and lower fluid chambers, respectively. The upper fluid chamber is open to the atmosphere and the lower chamber is closed, being provided with a fluid conduit which is connected to a conventional vacuum pump (not shown).

With the circuit board positioned in the box, the terminal holes 28 are filled with a flowable insulating compound or paste 40 having as its predominant ingredient a finely divided ceramic material suspended in a solvent vehicle containing a binder which solidifies upon drying and curing. Preferably, the ceramic material, or alternatively finely divided sand or silica, comprises colloidal sized particles suspended in a binder such as epoxy or polyester resin and a solvent such as acetone. The ceramic paste 40 is spread over the top surface of the circuit board 10 by means of a rubber squeegee or the like to force the paste 40 downwardly into the holes 28. The paste should penetrate sufficiently into the holes 28 to completely fill the same as shown in FIG. 1. The squeegee found to be suitable for this purpose is the common variety used in connection with silk-screening processes.

If the paste 40 does not completely fill the holes 28 when spread over the board as above due to the paste 40 being too viscous, it may be thinned to the desired consistency by adding a suitable thinner, such as acetone. Alternatively, should the paste be too thin, it may be allowed to stand for a few seconds either before or after it has been spread over the top surface of the circuit board 10.

Figure 2:
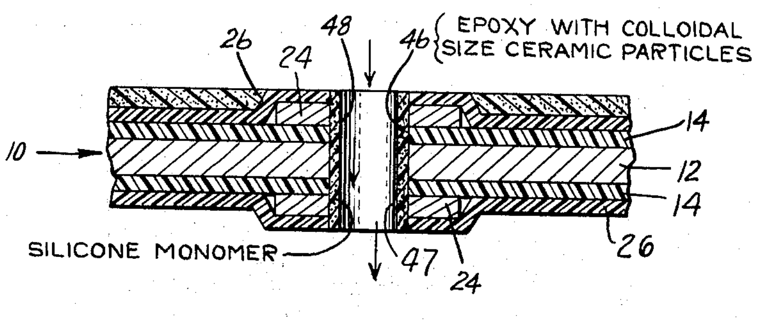
FIG. 2 is an enlarged fragmentary sectional view of the terminal hole of FIG. 1 illustrating another step in the process.

With the paste 40 now filling terminal holes 28 of the circuit board, the fluid, in this case air, in the lower fluid chamber of the box is withdrawn by means of a conventional vacuum pump thereby creating a pressure differential between the fluid chambers and, or in other words between the top and bottom surfaces of the circuit board, this differential pressure acting downwardly against surface 42 of the circuit board 10 causing air to flow downwardly through terminal hole 28, the air forcing excess paste 40 therein to disperse downwardly. A portion of the paste 46 adheres to the walls 48 of terminal holes 28 as illustrated in FIG. 2, forming a coating or lining which covers the entire wall or surface 48 of each of the terminal holes 28.

It is of course apparent that while causing a flow of air or gaseous fluid through holes 28 by means of reduced pressure in lower box chamber, this flow of fluid could also be caused by applying increased pressure to the upper side 42 of the circuit board 10. Similarly, any fluid, gas or liquid, having a low viscosity and which does not chemically react with the paste could be used to force the excess paste 40 from the holes 28.

The thickness of the lining can vary in proportion to the viscosity of the paste and the pressure differential at the time when the fluid is caused to flow through holes 28 whereby increasing or decreasing the viscosity of the paste 40 as described above provides a direct and reliable way to control the lining thickness.

The paste is allowed to air dry for a brief period sufficient to allow the paste 40 to set-up on the walls 48 of the holes 28. Any excess paste on the surface 42 of the circuit board 10 may now be scraped therefrom with a conventional spatula, putty knife or the like, care being taken to avoid gouging or otherwise damaging the liner 48 and film 26. Preferably, this excess material should be removed a few minutes after the introduction of the paste 40 into the terminal holes 28, because the paste will rapidly and progressively continue to air dry and become more difficult to remove.

The board 10, with the excess paste 40 removed as described above, is allowed thoroughly to cure at temperatures and for a period of time as required for the binder material used. This curing typically requires a period of approximately 4 hours at room temperatures for materials described herein.

The protective film 26 is now removed from the board.

The cured ceramic paste described herein possesses some porosity in the surface thereof, and for some applications it is desirable to moisture-proof or hermetically seal the surface of the linings. This is done in this specific example prior to removing the protective film 26 by applying a liquid sealant having a viscosity of 100 centipoises or less to the surface of the linings 46 as at 47 (FIG. 2). At this time, the board is placed in an oven and baked at a temperature of about 250° F for approximately 10 minutes to drive off any absorbed moisture in the liner. While the board is still hot, the sealant may be applied by dipping the board 10 in cool sealant solution and allowing it to soak therein for a time sufficient to allow the sealant to penetrate the pores in the liner 46. The board is then withdrawn from the solution and the excess sealant removed as by shaking. It has been found that sealant solutions which include a low viscosity silicone monomer which polymerizes in subsequent curing and drying is suitable for this purpose, it being apparent however that other sealant solutions having a viscosity of 100 centipoises or less can be used. The protective film 26 is removed from the board preferably prior to the sealant being cured, for example from 10 to 30 minutes after dipping. The sealant is now cured.

Figure 3:
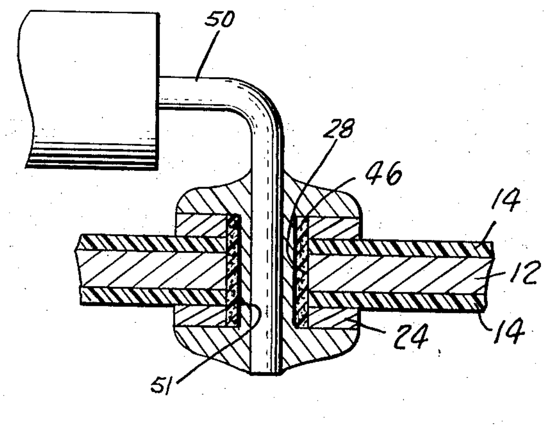
FIG. 3 is a fragmentary cross-sectional view through a terminal hole of a metallic core printed-circuit board illustraing a circuit component connected thereto.

With the sealant cured, the board is thoroughly cleaned and circuit components assembled thereto as shown in FIG. 3 with their leads 50 extending through terminal holes 28, these components being fixedly secured and electrically connected to the circuit board 10 by conventional methods, such as wave or hand soldering.

A specific example of a suitable insulating paste that has been used in practicing the method of this invention is a premixed paste of colloidal sized particles of ceramic suspended in an acetone solvent vehicle containing an epoxy binder. A suitable paste is sold under the tradename Ceramacoat 512 by Aremco Products, Inc., which paste requires an air curing time of about 4 hours. A suitable sealant is a low viscosity silicone monomer which polymerizes upon curing, the sealant having a viscosity of 100 centipoises and sold under the tradename Aremco-Seal 529 by Aremco Products, Inc. When using this sealant, the circuit board is heated to a temperature of about 250° F prior to dipping into the sealant. The sealant is cured by air drying for 1 hour, baking at 250° F for 1 hour, followed by baking at 350° F for 1 hour.

It can thus be seen that this invention provides a method for insulating the walls of terminal holes in a metallic core printed-circuit board which considerably reduces the time and effort required to prepare the board for the application of circuit components thereto. Because the insulating lining for all of the terminal holes of a particular board are formed in a single operation and under identical conditions, all of the terminal hole linings are relatively uniform in shape and wall thickness. Further, handling and manipulation of the board, required when individual terminal hole insulators are used, is substantially reduced thereby reducing the likelihood of damage to the board.

Another advantage effected by forming insulating linings by the method of this invention results from the smooth joint between the lining and the enlarged terminal portion 24 of the printed-circuit 20. Specifically, by suitably masking the surfaces of the printed-circuit board 10, through-connections (shown by the darkened line 51) between terminal portions 24 disposed on opposite sides of the board can be formed by conventional electrodeposition techniques, e.g., applying a layer or film 51 of conductive carbon, copper or aluminum to the insulator wall, this layer of film 51 being thereby intimately bonded thereto. Such throughconnections 51 may also be effected by conventional means such as tubular type metallic terminals inserted into the insulated holes and soldered to the printed-circuit terminations 24.

The present invention also provides a method for forming insulating linings in terminal holes in a metallic core circuit board which obviates the need for using separately fabricated and installed terminal hole insulators. Similarly, the ceramic lining, because it is intimately bonded to the wall of the terminal hole, provides a more efficient heat path for conducting heat from the components secured thereto to the metallic core of the board.

The method described above is fast, reliable and less costly than other methods now known and enables quantity production of printed-circuit assemblies utilizing metallic core printedcircuit boards with their attendant advantages at a cost less than the production of printed-circuit boards utilizing non-conductive core laminates but provided with other heat-dissipating elements.

While there have been described above the principles of this invention in connection with specific apparatus, it is to be clearly understood that this description is made only by way of example, and not as a limitation to the scope of the invention.

What is claimed is:

1. A circuit board including a supporting substrate of rigid metal, a conductive circuit, means securing said circuit to said substrate and insulating said circuit therefrom, said substrate and circuit having a terminal hole therethrough, and a lining of insulating material having a substantially uniform cross-section and being adhered to the wall of said hole, said material extending between the distal extremities of said hole, said insulating material including colloidal sized particles of ceramic homogeneously suspended in a hardened binder.

2. The circuit board of claim 1 including a hermetic sealing material adhered to the exposed surfaces of said lining.

3. The circuit of claim 2 in which said sealing material includes a silicone monomer.

4. The circuit board of claim 2 wherein said binder is a hardened epoxy resin.

5. The circuit board of claim 4 wherein said sealing material is a polymerized silicone monomer.

6. The circuit board of claim 1 including a layer of conductive material on the surface of said lining.

* * * * *